(12) United States Patent
Ang et al.

(10) Patent No.: US 7,761,754 B1
(45) Date of Patent: Jul. 20, 2010

(54) TECHNIQUES FOR TESTING MEMORY CIRCUITS

(75) Inventors: Chin Hai Ang, Bayan Lepas (MY); Tze Sin Tan, Island Glades (MY); Ala-Uddin Ismail, Sungai Nibong (MY); Siew Ling Yeoh, Georgetown (MY)

(73) Assignee: Altera Corporation, San Jose, CA (US)

( * ) Notice: Subject to any disclaimer, the term of this patent is extended or adjusted under 35 U.S.C. 154(b) by 295 days.

(21) Appl. No.: 12/055,099

(22) Filed: Mar. 25, 2008

(51) Int. Cl.
*G11C 29/00* (2006.01)

(52) U.S. Cl. .................. 714/718; 714/726; 714/733

(58) Field of Classification Search ............ 365/230.05, 365/189.04, 189.15; 711/169, 118; 714/718, 714/726, 733
See application file for complete search history.

(56) References Cited

U.S. PATENT DOCUMENTS

| | | | | |
|---|---|---|---|---|
| 4,888,741 A | * | 12/1989 | Malinowski | ........... 365/230.05 |
| 5,115,411 A | * | 5/1992 | Kass et al. | ............. 365/189.04 |
| 5,910,928 A | * | 6/1999 | Joffe | ...................... 365/230.05 |
| 5,917,832 A | | 6/1999 | Baeg et al. | |
| 6,170,046 B1 | * | 1/2001 | Joffe et al. | ................... 711/169 |
| 6,370,617 B1 | * | 4/2002 | Lu et al. | ...................... 711/118 |
| 6,449,740 B1 | * | 9/2002 | Yoshie | ....................... 714/718 |
| 6,492,833 B1 | | 12/2002 | Asson et al. | |
| 6,545,937 B2 | * | 4/2003 | Pawlowski | ............. 365/189.15 |
| 6,680,871 B1 | | 1/2004 | Prince | |
| 7,000,165 B1 | | 2/2006 | Asson et al. | |
| 7,257,751 B2 | * | 8/2007 | Stong et al. | .................. 714/733 |
| 7,266,028 B1 | | 9/2007 | Ghosh Dastidar | |

* cited by examiner

*Primary Examiner*—David Ton
(74) *Attorney, Agent, or Firm*—Steven J. Cahill

(57) ABSTRACT

An integrated circuit includes a memory circuit, a read address register coupled to a read address port of the memory circuit, a write address register coupled to a write address port of the memory circuit, and a multiplexer configurable to transmit a read address bit from the write address register to the read address register in response to a read control signal. The read address register loads the read address bit into the memory circuit through the read address port during a test of the memory circuit. The integrated circuit may include a multiplexer configurable to transmit a write address bit from the read address register to the write address register in response to a write control signal. The write address register loads the write address bit into the memory circuit through the write address port during the test of the memory circuit.

22 Claims, 9 Drawing Sheets

US 7,761,754 B1

TECHNIQUES FOR TESTING MEMORY CIRCUITS

BACKGROUND OF THE INVENTION

The present invention relates to electronic circuits, and more particularly, to techniques for testing memory circuits.

Built-in-self-test (BIST) is a technique that can be used to test memory circuits. BIST can be used in programmable integrated circuits.

BRIEF SUMMARY OF THE INVENTION

According to some embodiments, an integrated circuit includes a memory circuit, a read address register coupled to a read address port of the memory circuit, a write address register coupled to a write address port of the memory circuit, and a multiplexer configurable to transmit a read address bit from the write address register to the read address register in response to a read control signal. The read address register loads the read address bit into the memory circuit through the read address port during a test of the memory circuit.

According to other embodiments, the integrated circuit includes a multiplexer configurable to transmit a write address bit from the read address register to the write address register in response to a write control signal. The write address register loads the write address bit into the memory circuit through the write address port during the test of the memory circuit.

According to further embodiments, the integrated circuit includes a data register coupled to a data input of the memory circuit, a logic gate coupled to receive a first data bit from the data register and a flip data control signal, and a multiplexer coupled to transmit an output signal of the logic gate to the data register in response to a scan enable signal. The data register loads the first data bit and a second data bit into the memory circuit through the data input during a test of the memory circuit in two consecutive cycles of a clock signal. The second data bit is generated from the output signal of the logic gate.

Various objects, features, and advantages of the present invention will become apparent upon consideration of the following detailed description and the accompanying drawings, in which like reference designations represent like features throughout the figures.

DETAILED DESCRIPTION OF THE INVENTION

A field programmable gate array (FPGA) typically has numerous programmable logic blocks and memory circuits that are interconnected by a programmable routing network. A customer design for an FPGA can be converted into a structured application specific integrated circuit (ASIC) design by replacing the programmable routing network with fixed wire interconnects and maintaining the same design for the programmable logic blocks and memory circuits.

A dedicated BIST circuit can be placed near each memory circuit in a structured ASIC in order to test each memory circuit. If the ASIC has a large number of small memory circuits, then this technique requires a large number of BIST circuits. A large number of BIST circuits would require a large amount of extra die area in the ASIC, which is undesirable.

Alternatively, one BIST circuit can test multiple memory circuits in a structured ASIC. A distributed BIST should be placed at an optimal location to provide deterministic timing of signals transmitted between the BIST and the memory circuits. Therefore, the memory circuits and the BIST should be placed at fixed locations on the structured ASIC. However, this approach is not practical in a structured ASIC, because small memory arrays in each customer design for the FPGA may be placed in different memory circuits in different part of the die during the placement process.

Some embodiments of the present invention include test circuits for testing memory circuits in an integrated circuit at a high-speed in a cost effective manner. The test circuits can use existing circuitry and a small amount of extra circuitry. The test circuits do not require a significant amount of extra die area in the integrated circuit. Some embodiments of the present invention are particularly useful for testing numerous small memory circuits in a structured ASIC. Various embodiments of the present invention can be used to test a variety of memory circuits such as Flash memory, EEPROM memory, random access memory (RAM), flip-flop memory, etc.

Figure 1:
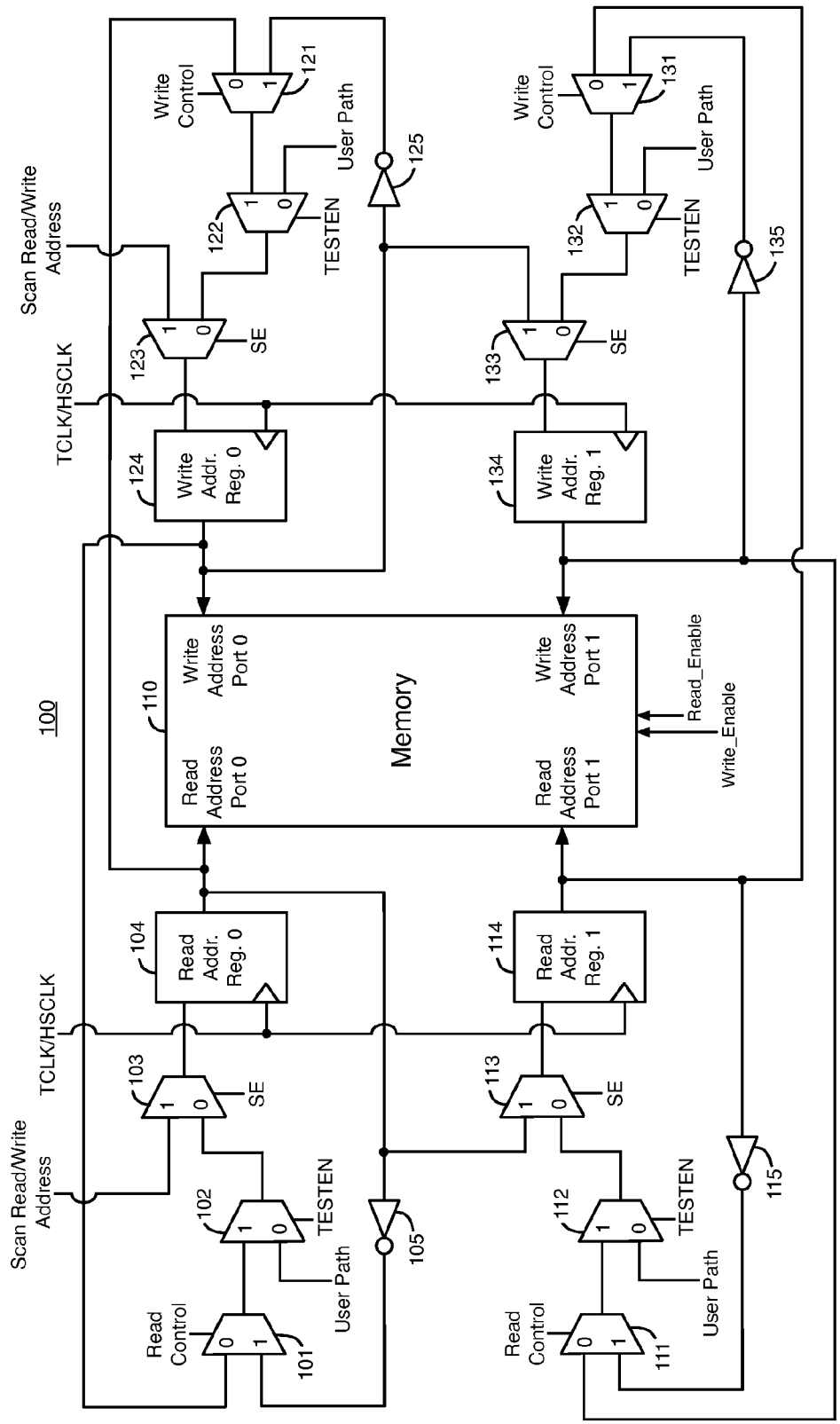
FIG. 1 illustrates an example of circuitry that can be used to load addresses into a memory circuit at a high frequency, according to an embodiment of the present invention.

According to some embodiments, a test circuit uses existing circuitry to form a back-to-back register pair that enables consecutive memory operations. FIG. 1 illustrates an example of how read and write addresses can be loaded into a memory circuit at a high-speed, according to an embodiment of the present invention.

Test data and test addresses are used to test memory circuits. The test data and test addresses are scanned into the integrated circuit containing the memory circuit through external terminals (i.e., pins) of the integrated circuit. Typically, the frequency at which the test data and test addresses are scanned into the integrated circuit through the pins is significantly less than the maximum frequency at which the memory circuits can write and read data. The circuitry of FIG. 1 can load read and write addresses into a memory circuit to test the memory circuit at the full clock signal frequency of the memory circuit. The circuitry of FIG. 1 can test a memory circuit at a frequency that is significantly greater than the frequency used to scan data and addresses into the integrated circuit.

FIG. 1 illustrates an example of circuitry that can be used to load addresses into a memory circuit at a high frequency, according to an embodiment of the present invention. Circuit 100 of FIG. 1 includes memory circuit 110; multiplexers 101-103, 111-113, 121-123, and 131-133; read address registers 104 and 114; write address registers 124 and 134; and inverters 105, 115, 125, and 135. Circuit 100 is typically fabricated on an integrated circuit, such as a programmable logic integrated circuit or an ASIC. Programmable logic integrated circuits include, for example, field programmable gate arrays and programmable logic devices.

The output terminal of multiplexer 103 is coupled to the data input terminal of read address register 104. The output terminal of multiplexer 113 is coupled to the data input terminal of read address register 114. The output terminal of multiplexer 123 is coupled to the data input terminal of write address register 124. The output terminal of multiplexer 133 is coupled to the data input terminal of write address register 134. Multiplexers 101 and 111 are controlled by the Read Control signal, and multiplexers 121 and 131 are controlled by the Write Control signal.

A clock routing network is coupled to the clock input terminals of registers 104, 114, 124, and 134. The clock routing network transmits either a test clock signal (TCLK) or a high-speed clock signal (HSCLK) to the clock input terminals of the registers.

The output terminal of read address register 104 is coupled to read address port 0 of memory 110. The output terminal of read address register 114 is coupled to read address port 1 of memory 110. The output terminal of write address register 124 is coupled to write address port 0 of memory 110. The output terminal of write address register 134 is coupled to write address port 1 of memory 110. The read and write address ports are input terminals of memory circuit 110.

Only two read address registers, two read address ports, two write address registers, and two write address ports are shown in FIG. 1 to simplify the drawing. In other embodiments of the present invention, the memory circuit can have any suitable number of read and write address ports in addition to a corresponding number of read address registers (e.g., 4-6), write address registers (e.g., 4-6), and multiplexers, that are coupled together according to the configuration shown in FIG. 1.

In one mode of operation of circuit 100, two write operations are performed in two consecutive clock cycles at the operating clock frequency of memory circuit 110 to test the write function of memory circuit 110. The two write operations are referred to as a write followed by write test. To implement a write followed by write test, write address bits are scanned into registers 104, 114, 124, and 134 from an external source through pins of the integrated circuit that contains circuit 100.

A scan enable (SE) signal is transmitted to the select input terminals of multiplexers 103, 113, 123, and 133. Before the write address bits are scanned into the registers, the SE signal is pulled to a logic high state. When the SE signal is in a logic high state, multiplexers 103, 113, 123, and 133 transmit the signals at their 1 input terminals to the data input terminals of registers 104, 114, 124, and 134, respectively. Subsequently, two write address bits are serially shifted into read address registers 104 and 114, and two more write address bits are serially shifted into write address registers 124 and 134. The four write address bits in this example are referred to as write address bits 1A, 1B, 2A, and 2B.

Registers 104, 114, 124, and 134 are driven by the test clock signal TCLK while the write address bits are shifted into the registers. The TCLK clock signal has a lower frequency than the operating frequency of memory circuit 110. Thus, the write address bits are shifted into the registers at a low frequency during a slow scan.

Initially, write address bit 1B is transmitted from the 1 input terminal of multiplexer 123 to the data input terminal of write address register 124, and write address bit 2B is transmitted from the 1 input terminal of multiplexer 103 to the data input terminal of read address register 104. In the first clock cycle of the TCLK clock signal, register 124 stores write address bit 1B at its output terminal, and register 104 stores write address bit 2B at its output terminal.

Then, multiplexer 133 transmits write address bit 1B from the output terminal of register 124 to the data input terminal of write address register 134, and multiplexer 113 transmits write address bit 2B from the output terminal of register 104 to the data input terminal of read address register 114. Also, write address bit 1A is transmitted from the 1 input terminal of multiplexer 123 to the data input terminal of write address register 124, and write address bit 2A is transmitted from the 1 input terminal of multiplexer 103 to the data input terminal of read address register 104.

In the second clock cycle of the TCLK clock signal, write address register 124 stores write address bit 1A at its output terminal, write address register 134 stores write address bit 1B at its output terminal, read address register 104 stores write address bit 2A at its output terminal, and read address register 114 stores write address bit 2B at its output terminal.

After the write address bits are stored at the output terminals of the registers, the write address bits are loaded into the write ports of memory circuit 110 to implement the write followed by write test of memory circuit 110. The write followed by write test is performed at a higher frequency than the process of serially shifting the write address bits into the registers. A high-speed clock signal HSCLK is transmitted through the clock routing network to the clock input terminals of registers 104, 114, 124, and 134 during each high frequency at-speed test of memory 110. The frequency of HSCLK is greater than the frequency of TCLK. For example, the frequency of TCLK may be 10 MHz, and the frequency of HSCLK may be 600 MHz. The frequency of clock signal HSCLK equals an operating frequency at which memory circuit 110 is designed to function.

Prior to a high frequency at-speed test of memory circuit 110, the scan enable (SE) signal is pulled to a logic low state, causing multiplexers 103, 113, 123, and 133 to transmit signals at their 0 input terminals from multiplexers 102, 112, 122, and 132 to the data input terminals of registers 104, 114, 124, and 134, respectively. The test enable signal TESTEN is transmitted to the select input terminals of multiplexers 102, 112, 122, and 132. The TESTEN signal is pulled to a logic high state prior to a high frequency at-speed test of memory 110, causing multiplexers 102, 112, 122, and 132 to transmit the signals at their 1 input terminals from multiplexers 101, 111, 121, and 131 to the 0 input terminals of multiplexers 103, 113, 123, and 133, respectively.

The Write Control signal is transmitted to the select input terminals of multiplexers 121 and 131. The Write Control signal is pulled to a logic low state before a write followed by write test, causing multiplexers 121 and 131 to transmit the signals at their 0 input terminals from the output terminals of registers 104 and 114 to the 1 input terminals of multiplexers 122 and 132, respectively. As a result, write address bit 2A is transmitted from register 104 to the data input terminal of register 124 through multiplexers 121-123, and write address bit 2B is transmitted from register 114 to the data input terminal of register 134 through multiplexers 131-133. The Read Control signal is transmitted to the select input terminals of multiplexers 101 and 111. The Read Control signal is pulled to a logic high state before a write followed by write test.

In the first clock cycle of HSCLK during the write followed by write test, write address bit 1B is loaded into memory circuit 110 through write address port 1 from register 134, and write address bit 1A is loaded into memory circuit 110 through write address port 0 from register 124. Loading write address bits 1A-1B into memory 110 initiates a first write operation during the test. During each write operation, data is stored in memory circuit 110 in memory cells at the addresses loaded into memory circuit 110 through the write address ports. The process for loading the data into memory circuit 110 at the frequency of clock signal HSCLK (i.e., at-speed) is described in detail below with respect to FIG. 3.

Figure 2A:
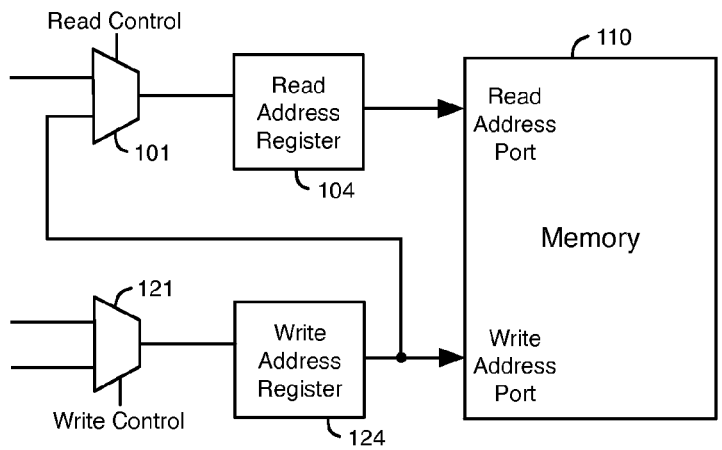
FIG. 2A is a simplified diagram of the circuitry of FIG. 1 that illustrates signal paths used in a read followed by read test, according to an embodiment of the present invention.
Figure 2B:
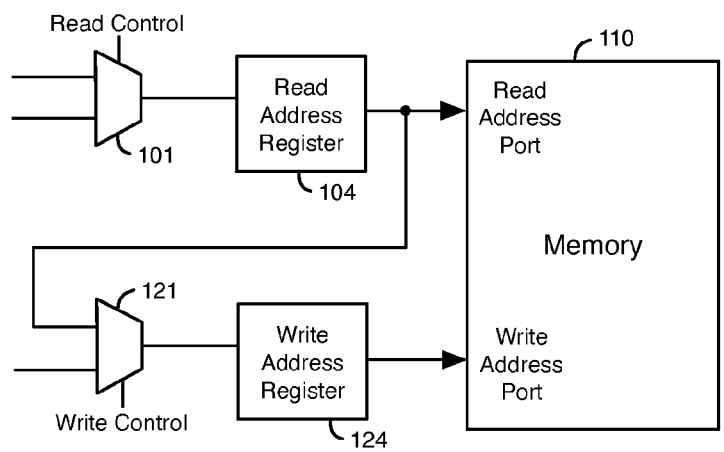
FIG. 2B is a simplified diagram of the circuitry of FIG. 1 that illustrates signal paths used in a write followed by write test, according to an embodiment of the present invention.

Also, in the first clock cycle of HSCLK, register 134 stores write address bit 2B at its output terminal, and register 124 stores write address bit 2A at its output terminal. In the next consecutive clock cycle of HSCLK, write address bit 2B is loaded into memory circuit 110 through write address port 1 from register 134, and write address bit 2A is loaded into memory circuit 110 through write address port 0 from register 124. Loading write address bits 2A-2B into memory 110 initiates the second write operation during the test. Write address bits 1A-2B are loaded into memory 110 at the frequency of the HSCLK clock signal, which is the desired at-speed testing frequency, in two consecutive clock cycles of HSCLK. A clock cycle is the period of a clock signal. FIG. 2B is a simplified diagram of circuit 100 that illustrates signal paths used in the write followed by write test described above, according to an embodiment of the present invention. The process described above for loading two write addresses into memory circuit 110 can be repeated to test all of the memory cells in memory circuit 110 by loading the entire address range of memory circuit 110 into the write address ports. Each memory cell in memory circuit 110 is assigned to a unique address.

In another mode of operation of circuit 100, two read operations are performed in two consecutive clock cycles at the clock frequency of memory circuit 110 (i.e., at-speed) to test the read function of memory circuit 110. The two read operations are also referred to as a read followed by read test. Read address bits are serially shifted into registers 104, 114, 124, and 134 from an external source for the test.

Prior to loading the read address bits into the registers, the scan enable (SE) signal is pulled to a logic high state at the select input terminals of multiplexer 103, 113, 123, and 133.

Then, two read address bits are serially shifted into registers 104 and 114, and two more read address bits are serially shifted into registers 124 and 134. The read address bits are scanned into the integrated circuit that contains circuit 100 through pins of the integrated circuit. The four read address bits in this example are referred to as read address bits 1A, 1B, 2A, and 2B. Registers 104, 114, 124, and 134 are driven by the test clock signal TCLK, while the read address bits are shifted into the registers. The read address bits are shifted into the registers at the low frequency clock rate of the TCLK clock signal during a slow scan.

Initially, read address bit 1B is transmitted from the 1 input terminal of multiplexer 103 to the data input terminal of register 104, and read address bit 2B is transmitted from the 1 input terminal of multiplexer 123 to the data input terminal of register 124. In the first clock cycle of the TCLK clock signal, register 104 stores read address bit 1B at its output terminal, and register 124 stores read address bit 2B at its output terminal.

Then, multiplexer 113 transmits read address bit 1B from the output terminal of register 104 to the data input terminal of read address register 114, and multiplexer 133 transmits read address bit 2B from the output terminal of register 124 to the data input terminal of write address register 134. Also, read address bit 1A is transmitted from the 1 input terminal of multiplexer 103 to the data input terminal of read address register 104, and read address bit 2A is transmitted from the 1 input terminal of multiplexer 123 to the data input terminal of write address register 124.

In the second clock cycle of the TCLK clock signal, read address register 104 stores read address bit 1A at its output terminal, read address register 114 stores read address bit 1B at its output terminal, write address register 124 stores read address bit 2A at its output terminal, and write address register 134 stores read address bit 2B at its output terminal.

After the read address bits are stored at the output terminals of the registers, the read address bits are loaded into memory circuit 110 through the read address ports to implement the read followed by read test. The read followed by read test of memory circuit 110 is performed at a higher frequency than the process of serially shifting the read address bits into the registers. Specifically, the read followed by read test is performed at the operating frequency of memory circuit 110 (i.e., at-speed), which is the frequency of clock signal HSCLK. A high-speed clock signal HSCLK is transmitted to the clock input terminals of registers 104, 114, 124, and 134 during the at-speed test of memory circuit 110.

Prior to an at-speed test of memory circuit 110, the scan enable (SE) signal is pulled to a logic low state, causing multiplexers 103, 113, 123, and 133 to transmit signals at their 0 input terminals from multiplexers 102, 112, 122, and 132 to the data input terminals of registers 104, 114, 124, and 134, respectively. The TESTEN signal is pulled to a logic high state prior to an at-speed test, causing multiplexers 102, 112, 122, and 132 to transmit the signals at their 1 input terminals from multiplexers 101, 111, 121, and 131 to the 0 input terminals of multiplexers 103, 113, 123, and 133, respectively.

The Read Control signal is pulled to a logic low state before a read followed by read test, causing multiplexers 101 and 111 to transmit the signals at their 0 input terminals from registers 124 and 134 to the 1 input terminals of multiplexers 102 and 112, respectively. As a result, read address bit 2A is transmitted from the output terminal of register 124 to the data input terminal of register 104 through multiplexers 101-103, and read address bit 2B is transmitted from the output terminal of register 134 to the data input terminal of register 114 through multiplexers 111-113. The Write Control signal is pulled to a logic high state before the read followed by read test.

In the first clock cycle of HSCLK during the at-speed read followed by read test, read address bit 1B is loaded into memory circuit 110 through read address port 1 from register 114, and read address bit 1A is loaded into memory circuit 110 through read address port 0 from register 104. Loading read address bits 1A-1B into memory 110 initiates a first read operation of memory 110 during the test. Also, in the first clock cycle of HSCLK, register 114 stores read address bit 2B at its output terminal, and register 104 stores read address bit 2A at its output terminal. In the next consecutive clock cycle of HSCLK, read address bit 2B is loaded into memory circuit 110 through read address port 1 from register 114, and read address bit 2A is loaded into memory circuit 110 through read address port 0 from register 104. Loading read address bits 2A-2B into memory 110 initiates the second read operation of memory 110 during the test. Read address bits 1A-2B are loaded into memory 110 at the frequency of the HSCLK signal, which is the desired at-speed testing frequency, in two consecutive clock cycles of HSCLK. FIG. 2A is a simplified diagram of circuit 100 that illustrates signal paths used in the read followed by read test described above, according to an embodiment of the present invention. The process described above for loading read address bits into memory circuit 110 can be repeated to test all of the memory cells in memory circuit 110 by loading the entire address range of memory circuit 110 into the read address ports.

In another mode of operation of circuit 100, a write operation and then a read operation are performed in two consecutive clock cycles at the clock frequency of memory circuit 110 to test the write and read functions of memory circuit 110 (i.e., a write followed by read test). Initially, the scan enable (SE) signal is pulled to a logic high state. Then, read address bits are serially shifted into read address registers 104 and 114 through multiplexers 103 and 113, and write address bits are serially shifted into write address registers 124 and 134 through multiplexers 123 and 133, as described above. Registers 104, 114, 124, and 134 are driven by the test clock signal TCLK while the read and write address bits are shifted into the registers.

Prior to the write followed by read test, the SE signal is pulled to a logic low state, and the TESTEN signal is pulled to a logic high state. The Write Control signal is pulled to a logic high state, causing multiplexers 121 and 131 to transmit the output signals of inverters 125 and 135 to the 1 input terminals of multiplexers 122 and 132, respectively.

The Read Control signal is pulled to a logic high state, causing multiplexers 101 and 111 to transmit the output signals of inverters 105 and 115 to the 1 input terminals of multiplexers 102 and 112, respectively. As a result, the read address bit stored at the output terminal of register 104 is inverted by inverter 105 and transmitted to the data input terminal of register 104 through multiplexers 101-103, and the read address bit stored at the output terminal of register 114 is inverted by inverter 115 and transmitted to the data input terminal of register 114 through multiplexers 111-113.

During the write followed by read test, the high-speed clock signal HSCLK is transmitted to the clock input terminals of registers 104, 114, 124, and 134. In the first clock cycle of HSCLK, a write address bit is loaded from register 124 into memory circuit 110 through write address port 0, and a write address bit is loaded from register 134 into memory circuit 110 through write address port 1. Also during the first clock cycle of HSCLK, registers 104 and 114 store the inverted read address bits at their data output terminals. In the next consecutive clock cycle of HSCLK, the first inverted read address bit is loaded from register 104 into memory circuit 110 through read address port 0, and the second inverted read address bit is loaded from register 114 into memory circuit 110 through read address port 1.

Thus, the write followed by read test flips the logic states of the read address bits before they are loaded into memory 110. For example, if a logic 0 write address bit is scanned into register 124, and a logic 0 read address bit is scanned into register 104, a logic 0 is loaded into memory circuit 110 through write address port 0 in one clock cycle of HSCLK, and then a logic 1 is loaded into memory circuit 110 through read address port 0 in the next consecutive clock cycle of HSCLK.

Memory circuit 100 also receives Read Enable and Write Enable signals. To perform a write operation, the Write Enable signal is set in a logic high state, and the Read Enable signal is set in a logic low state. To perform a read operation, the Write Enable signal is set in a logic low state, and the Read Enable signal is set in a logic high state.

In another mode of operation of circuit 100, a read operation and then a write operation are performed in two consecutive clock cycles at the clock frequency of memory circuit 110 to test the read and write functions of memory circuit 110 (i.e., a read followed by write test). Initially, the scan enable (SE) signal is pulled to a logic high state. Then, read address bits are serially shifted into read address registers 104 and 114 through multiplexers 103 and 113, and write address bits are serially shifted into write address registers 124 and 134 through multiplexers 123 and 133, as described above. Registers 104, 114, 124, and 134 are driven by the test clock signal TCLK while the read and write address bits are serially shifted into the registers.

Prior to the read followed by write test, the SE signal is pulled to a logic low state, the TESTEN signal is pulled to a logic high state, the Read Control signal is pulled to a logic high state, and the Write Control signal is pulled to a logic high state. When the Write Control signal is a logic high, the write address bit stored at the output terminal of register 124 is inverted by inverter 125 and transmitted to the data input terminal of register 124 through multiplexers 121-123, and the write address bit stored at the output terminal of register 134 is inverted by inverter 135 and transmitted to the data input terminal of register 134 through multiplexers 131-133.

During the read followed by write test, the high-speed clock signal HSCLK is transmitted to the clock input terminals of registers 104, 114, 124, and 134. In the first clock cycle of HSCLK, a read address bit is loaded from register 104 into memory circuit 110 through read address port 0, and a read address bit is loaded from register 114 into memory circuit 110 through read address port 1. Also during the first clock cycle of HSCLK, registers 124 and 134 store the inverted write address bits at their data output terminals. In the next consecutive clock cycle of HSCLK, the first inverted write address bit is loaded from register 124 into memory circuit 110 through write address port 0, and the second inverted write address bit is loaded from register 134 into memory circuit 110 through write address port 1.

Thus, the read followed by write test flips the logic states of the write address bits before they are loaded into memory 110. For example, if a logic 0 write address bit is shifted into register 124, and a logic 0 read address bit is shifted into register 104, a logic 0 is loaded into memory circuit 110 through read address port 0 in one clock cycle of HSCLK, and then a logic 1 is loaded into memory circuit 110 through write address port 0 in the next consecutive clock cycle of HSCLK.

Figure 2C:
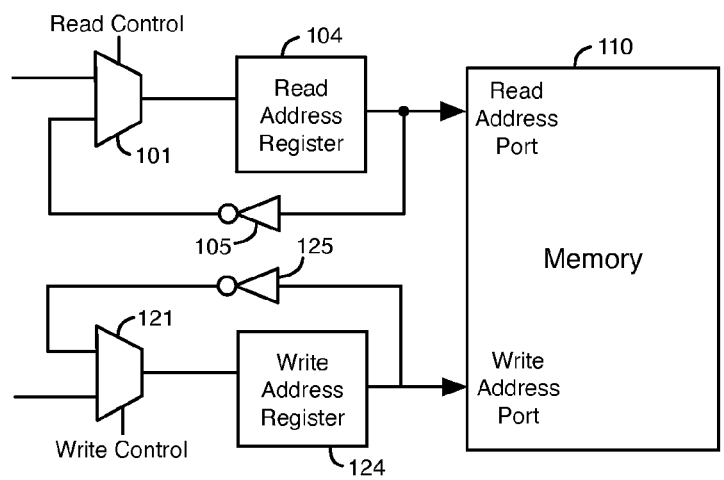
FIG. 2C is a simplified diagram of the circuitry of FIG. 1 that illustrates signal paths used in write followed by read and read followed by write tests, according to embodiments of the present invention.

FIG. 2C is a simplified diagram of circuit 100 that illustrates signal paths used in the write followed by read and read followed by write tests described above, according to embodiments of the present invention. Table 1 below shows the logic states of the Read and Write Control signals that are used during the four test modes described above.

TABLE 1

| Test | Read Control Signal | Write Control Signal |
| --- | --- | --- |
| Read Followed by Read | 0 | 1 |
| Read Followed by Write | 1 | 1 |
| Write Followed by Read | 1 | 1 |
| Write Followed by Write | 1 | 0 |

After the tests are completed, read and write address bits can be loaded into memory circuit 110 from a user path through registers 104, 114, 124, and 134. The TESTEN is pulled to a logic low state, causing multiplexers 102, 112, 122, and 132 to transmit signals on the user paths to multiplexers 103, 113, 123, and 133, respectively. The SE signal is pulled to a logic low state, causing multiplexers 103, 113, 123, and 133 to transmit the user path signals to the data input terminals of registers 104, 114, 124, and 134, respectively. The user path can, for example, transmit signals from programmable logic blocks or other memory circuits in an FPGA to circuit 100.

Figure 3:
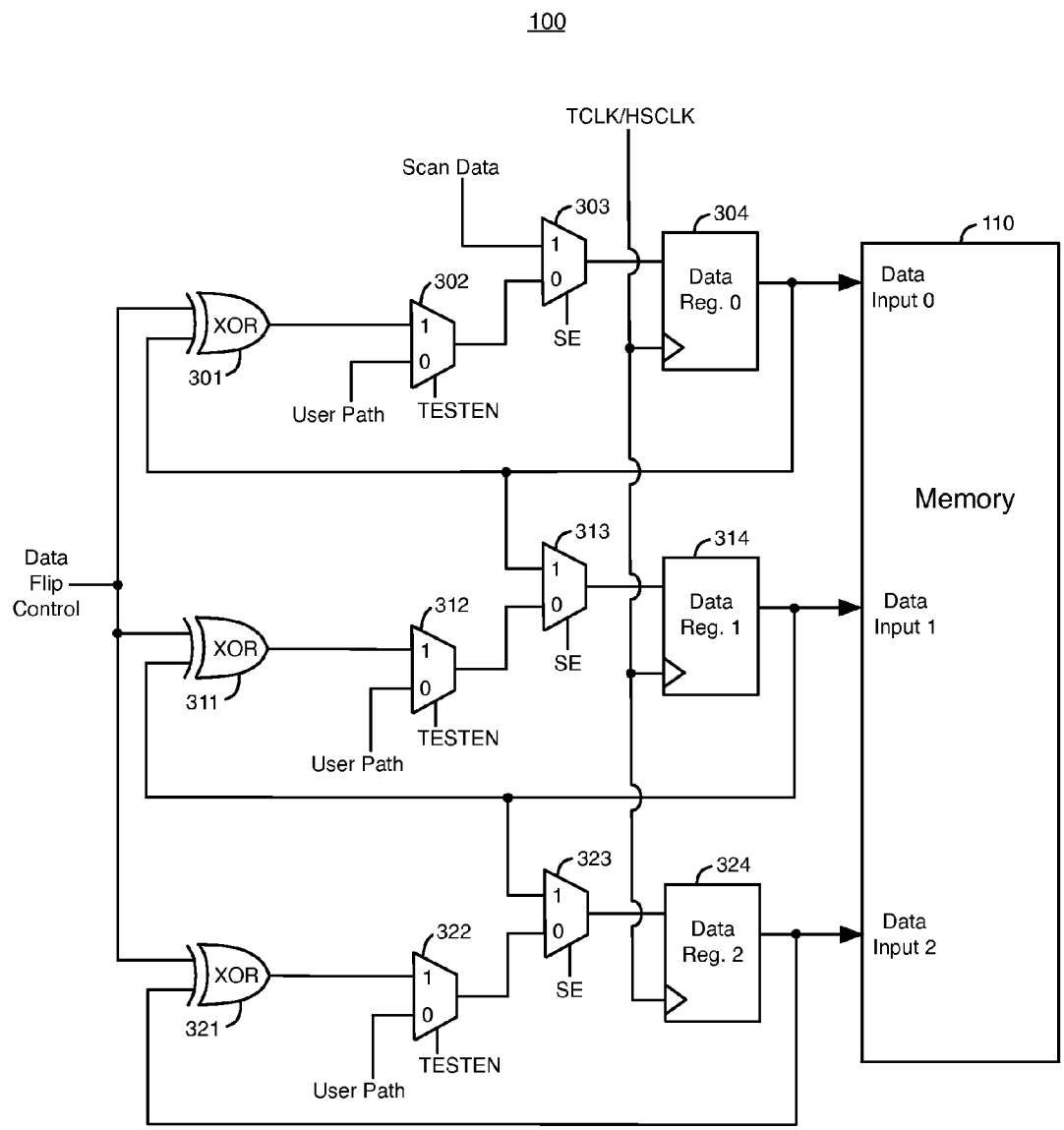
FIG. 3 illustrates an example of circuitry that can be used to load test data into a memory circuit at a high frequency, according to an embodiment of the present invention.

FIG. 3 illustrates an example of circuitry that can be used to load test data into a memory circuit at a high frequency, according to an embodiment of the present invention. FIG. 3 shows an additional portion of circuit 100 that includes memory circuit 110; data registers 304, 314, and 324; multiplexers 302, 312, 322, 303, 313, and 323; and exclusive OR (XOR) gates 301, 311, and 321.

The output terminals of multiplexers 303, 313, and 323 are coupled to the data input terminals of data registers 304, 314, and 324, respectively. The output terminals of data registers 304, 314, and 324 are coupled to data input 0, data input 1, and data input 2, respectively. Data inputs 0-2 are data input terminals of memory circuit 110. The clock routing network transmits the TCLK and HSCLK clock signals to the clock input terminals of registers 304, 314, and 324.

Only three data registers and three data input terminals of memory circuit 110 are shown in FIG. 3 to simplify the drawing. In other embodiments of the present invention, the memory circuit can have any suitable number of data input terminals (e.g., 20) in addition to a corresponding number of data registers, multiplexers, and XOR gates that are coupled together according to the configuration shown in FIG. 3.

The operation of FIG. 3 is now described. To begin the slow scan of the data bits into the data registers, the scan enable (SE) signal is pulled to a logic high state at the select input terminals of multiplexers 303, 313, and 323. Then, data bits are serially shifted into data registers 304, 314, and 324 one bit at a time through multiplexers 303, 313, and 323. The timing of registers 304, 314, and 324 is controlled by the low frequency TCLK clock signal, while the data bits are serially shifted into these registers.

The slow scan of data bits into the registers of FIG. 3 is now described in more detail. A first data bit is initially transmitted to the data input terminal of register 304 through multiplexer 303. In the first clock cycle of TCLK, the first data bit is stored at the output terminal of register 304, and a second data bit is transmitted to the data input terminal of register 304 through multiplexer 303. The first data bit is transmitted to the data input terminal of register 314 through multiplexer 313. In the second clock cycle of TCLK, the first data bit is stored at the output terminal of register 314, the second data bit is stored at the output terminal of register 304, and a third data bit is transmitted to the data input terminal of register 304 through multiplexer 303. The second data bit is transmitted to the data input terminal of register 314 through multiplexer 313, and the first data bit is transmitted to the data input terminal of register 324 through multiplexer 323. In the third clock cycle of TCLK, the first data bit is stored at the output terminal of register 324, the second data bit stored at the output terminal of register 314, and the third data bit is stored at the output terminal of register 304.

Prior to the at-speed test of memory circuit 110, the SE signal is pulled to a logic low state, the TESTEN signal is pulled to a logic high state, and a Data Flip Control signal is transmitted to the first input terminals of XOR gates 301, 311, and 321. The second input terminals of XOR gates 301, 311, and 321 are coupled to the output terminals of registers 304, 314, and 324, respectively. The output signals of XOR gates 301, 311, and 321 are transmitted to the data input terminals of data registers 304, 314, and 324, respectively, through the multiplexers when the SE signal is a logic low and the TESTEN signal is a logic high.

The logic state of the Data Flip Control signal determines whether the XOR gates flip the logic states of the data bits stored in the data registers or maintain these data bits in the same logic states. If the Data Flip Control signal is in a logic low state, then the output signals of XOR gates 301, 311, and 321 have the same logic states as the data bits stored at the output terminals of registers 304, 314, and 324, respectively, as shown in Table 2 below. If the Data Flip Control signal is in a logic high state, then the output signals of XOR gates 301, 311, and 321 have the opposite logic states as the data bits stored at the output terminals of registers 304, 314, and 324, respectively, as shown in Table 2 below.

TABLE 2

| Data Flip Control signal | Logic Value Stored in Data Register in 1$^{st}$ Operation | Logic Value Stored in Data Register in 2$^{nd}$ Operation |
| --- | --- | --- |
| 0 | 0 | 0 |
| 0 | 1 | 1 |
| 1 | 0 | 1 |
| 1 | 1 | 0 |

During the at-speed test of memory circuit 110, the data bits are loaded into memory circuit 110 at the frequency of clock signal HSCLK (i.e., at-speed) to test the read and write functions of memory circuit 110. The clock routing network transmits high-speed clock signal HSCLK to the clock input terminals of registers 304, 314, and 324 during the test. As a result, the data bits are loaded from registers 304, 314, and 324 into memory circuit 110 at the frequency of the high-speed clock signal HSCLK during the test. The data bits are loaded from data registers 304, 314, and 324 into memory circuit 110 at the same time that corresponding write address bits are loaded from the write address registers into memory circuit 110, as described in detail above.

The at-speed test is now described with respect to FIG. 3. In the first clock cycle of HSCLK during the test, the first three data bits stored at the output terminals of registers 304, 314, and 324 are loaded into memory circuit 110 through data inputs 0, 1, and 2, respectively. Also, data registers 304, 314, and 324 transmit the logic values from their input terminals to their output terminals in the first clock cycle of HSCLK. Thus, the logic states at the output terminals of XOR gates 301, 311, and 321 prior to the at-speed test are stored in registers 304, 314, and 324, respectively, after the first cycle of HSCLK as second data bits. In the next consecutive clock cycle of HSCLK during the test, the second data bits are loaded from registers 304, 314, and 324 into memory circuit 110 through data inputs 0, 1, and 2, respectively.

The procedure described above for loading data into memory circuit 110 at-speed can be used during a write followed by write test, a write followed by read test, or a read followed by write test. Data can be transferred out of memory 110 at the frequency of HSCLK during the read operations of each test using standard circuitry.

After the tests of memory circuit 110 are completed, data bits can be loaded into memory circuit 110 from user paths through data registers 304, 314, and 324. The TESTEN signal is pulled to a logic low state, causing multiplexers 302, 312, and 322 to transmit signals on the user paths to multiplexers 303, 313, and 323, respectively. The SE signal is pulled to a logic low state, causing multiplexers 303, 313, and 323 to transmit the user path signals to the data input terminals of registers 304, 314, and 324, respectively.

Figure 4A:
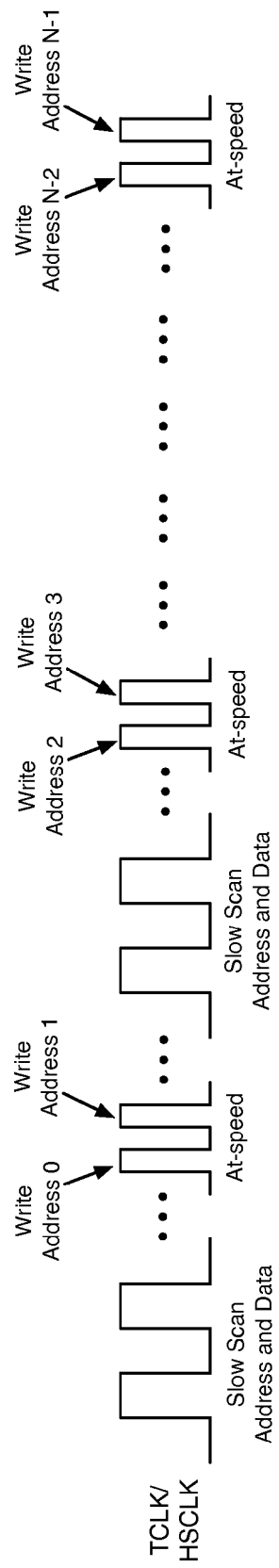
FIG. 4A illustrates the relative timing of the test and high-speed clock signals for the write followed by write tests of the memory circuit during the first pass of the full march algorithm, according to an embodiment of the present invention.
Figure 4B:
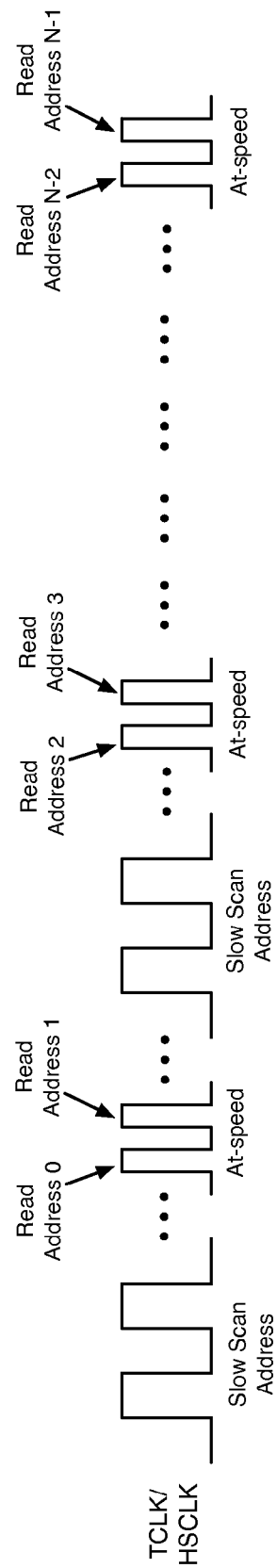
FIG. 4B illustrates the relative timing of the test and high-speed clock signals for the read followed by read tests of the memory circuit during the first pass of the full march algorithm, according to an embodiment of the present invention.
Figure 5A:
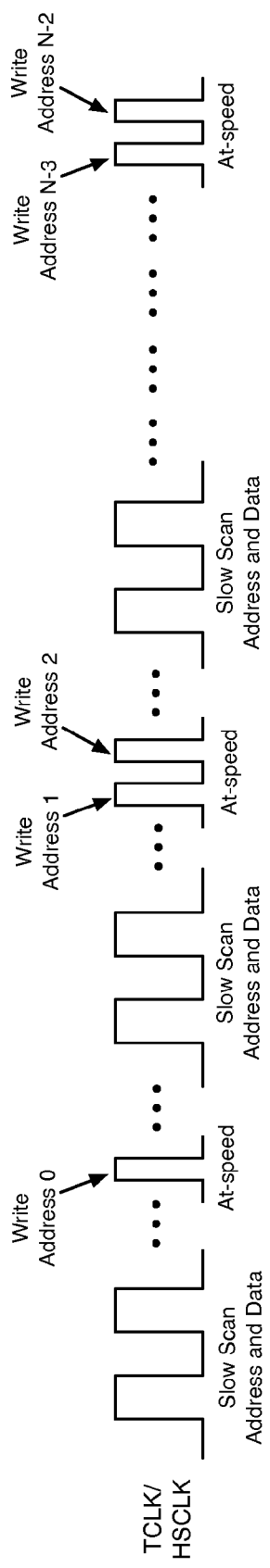
FIG. 5A illustrates the relative timing of the test and high-speed clock signals for the write followed by write tests of the memory circuit during the second pass of the full march algorithm, according to an embodiment of the present invention.
Figure 5B:
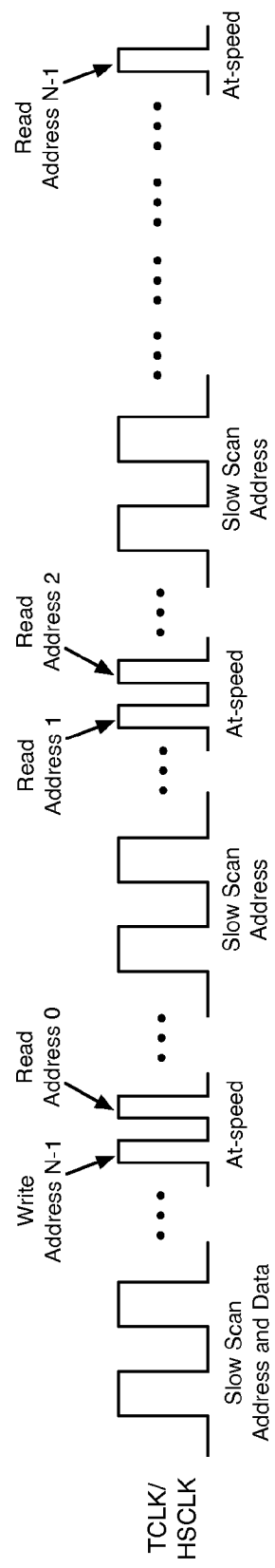
FIG. 5B illustrates the relative timing of the test and high-speed clock signals for the write followed by read and read followed by read tests of the memory circuit during the second pass of the full march algorithm, according to an embodiment of the present invention.

Further details of the operation of circuit 100 during a test are described with respect to FIGS. 4A-4B and 5A-5B. FIGS. 4A-4B and 5A-5B are timing diagrams of the TCLK and HSCLK clock signals during a full march algorithm that is used to test the memory cells at all of the addresses in memory circuit 110, according to an embodiment of the present invention. The full march algorithm is exercised twice to achieve full coverage, during a first pass as shown in FIGS. 4A-4B and during a second pass as shown in FIGS. 5A-5B.

The clock pulses shown in FIGS. 4A-4B and 5A-5B are transmitted to the address and data registers shown in FIGS. 1 and 3. The test clock signal TCLK is transmitted to the address and data registers during the slow scan, while the data and address bits are serially shifted into the registers. The pulses of the slow scan TCLK clock signal are shown as the wider pulses in FIGS. 4A-4B and 5A-5B. The high-speed HSCLK clock signal is transmitted to the address and data registers during an at-speed test of the memory circuit. The pulses of the at-speed HSCLK clock signal are shown as the narrower pulses in FIGS. 4A-4B and 5A-5B.

FIG. 4A illustrates the relative timing of the test and high-speed clock signals for the write followed by write tests of memory circuit 110 during the first pass of the full march algorithm, according to an embodiment of the present invention. FIG. 5A illustrates the relative timing of the test and high-speed clock signals for the write followed by write tests of memory circuit 110 during the second pass of the full march algorithm, according to an embodiment of the present invention. During each slow scan, the write address bits are serially shifted into the address registers, and the data bits are serially shifted into the data registers in two consecutive clock cycles of TCLK, as described above. During each subsequent write followed by write at-speed test, two sets of write address bits and two sets of data bits are loaded into memory circuit 110 in two consecutive clock cycles of HSCLK, as described above.

FIG. 4B illustrates the relative timing of the test and high-speed clock signals for the read followed by read tests of memory circuit 110 during the first pass of the full march algorithm, according to an embodiment of the present invention. FIG. 5B illustrates the relative timing of the test and high-speed clock signals for the write followed by read and read followed by read tests of memory circuit 110 during the second pass of the full march algorithm, according to an embodiment of the present invention. During each slow scan, the address bits are serially shifted into the address registers in two consecutive clock signals of TCLK, as described above. During the one write followed by read test shown in FIG. 5B, the write and read address bits and data bits are loaded into memory circuit 110 in two consecutive clock cycles of HSCLK, as described above. During each read followed by read test, the read address bits are loaded into memory circuit 110 in two consecutive clock cycles of HSCLK, as described above.

An N number of write addresses (numbered 0 to N−1) and N sets of data bits are loaded into memory circuit 110 during each pass of the march algorithm. An N number of read addresses (numbered 0 to N−1) are loaded into memory circuit 110 during each pass of the march algorithm. A $2^N$ number of write address registers and write address ports are used for N write addresses, and a $2^N$ number of read address registers and read address ports are used for N read addresses.

Using the notation $XY_Z$, where X=R for read and W for write, Y=logic state 0 or 1 for the data bit, and Z is the memory address, the sequence of steps for the march algorithm is $W0_0$, $W0_1$, $W0_2$, ..., $W0_{N-1}$, $R0_0$, $R0_1$, $R0_2$, ..., $R0_{N-1}$. The first pass achieves coverage of the $W0_0$-$W0_1$, $W0_2$-$W0_3$, ..., $R0_{N-2}$-$R0_{N-1}$ memory address pairs at the frequency of HSCLK. In other words, data bits are written to memory addresses 0 and 1 during two consecutive clock cycles of HSCLK, data bits are written to memory addresses 2 and 3 during two more consecutive clock cycles of HSCLK, etc. as shown in FIG. 4A. After the write functions are completed, data bits are read from memory addresses 0 and 1 during two consecutive clock cycles of HSCLK, data bits are read from memory addresses 2 and 3 during two more consecutive clock cycles of HSCLK, etc. as shown in FIG. 4B.

The second pass achieves coverage of the $W0_1$-$W0_2$, $W0_3$-$W0_4$, ..., $R0_{N-3}$-$R0_{N-2}$ memory address pairs. In other words, data bits are written to memory addresses 1 and 2 during two consecutive clock cycles of HSCLK, data bits are written to memory addresses 3 and 4 during two more consecutive clock cycles of HSCLK, etc. as shown in FIG. 5A. Data bits are written to memory address N−1 and read from memory address 0 during two consecutive clock cycles of HSCLK, data bits are read from memory addresses 1 and 2 during two more consecutive clock cycles of HSCLK, data bits are read from memory addresses 3 and 4 during another two more consecutive clock cycles of HSCLK, etc. as shown in FIG. 5B. Lastly, data bits are read from memory addresses N−3 and N−2 in two more consecutive clock cycles of HSCLK, and then data bits are read from memory address N−1.

Two passes of the march algorithm are performed so that each memory address in memory circuit 110 is tested next to its two numerically adjacent memory addresses during both read and write operations. Thus, memory address Q is tested next to memory address Q−1 in two consecutive clock cycles of HSCLK during both read and write operations, and memory address Q is tested next to memory address Q+1 in two consecutive clock cycles of HSCLK during both read and write operations. The march algorithm can be used to test read and write operations to all of the memory cells at all of the addresses in memory circuit 110, or a subset of the memory cells in circuit 110.

Figure 6:
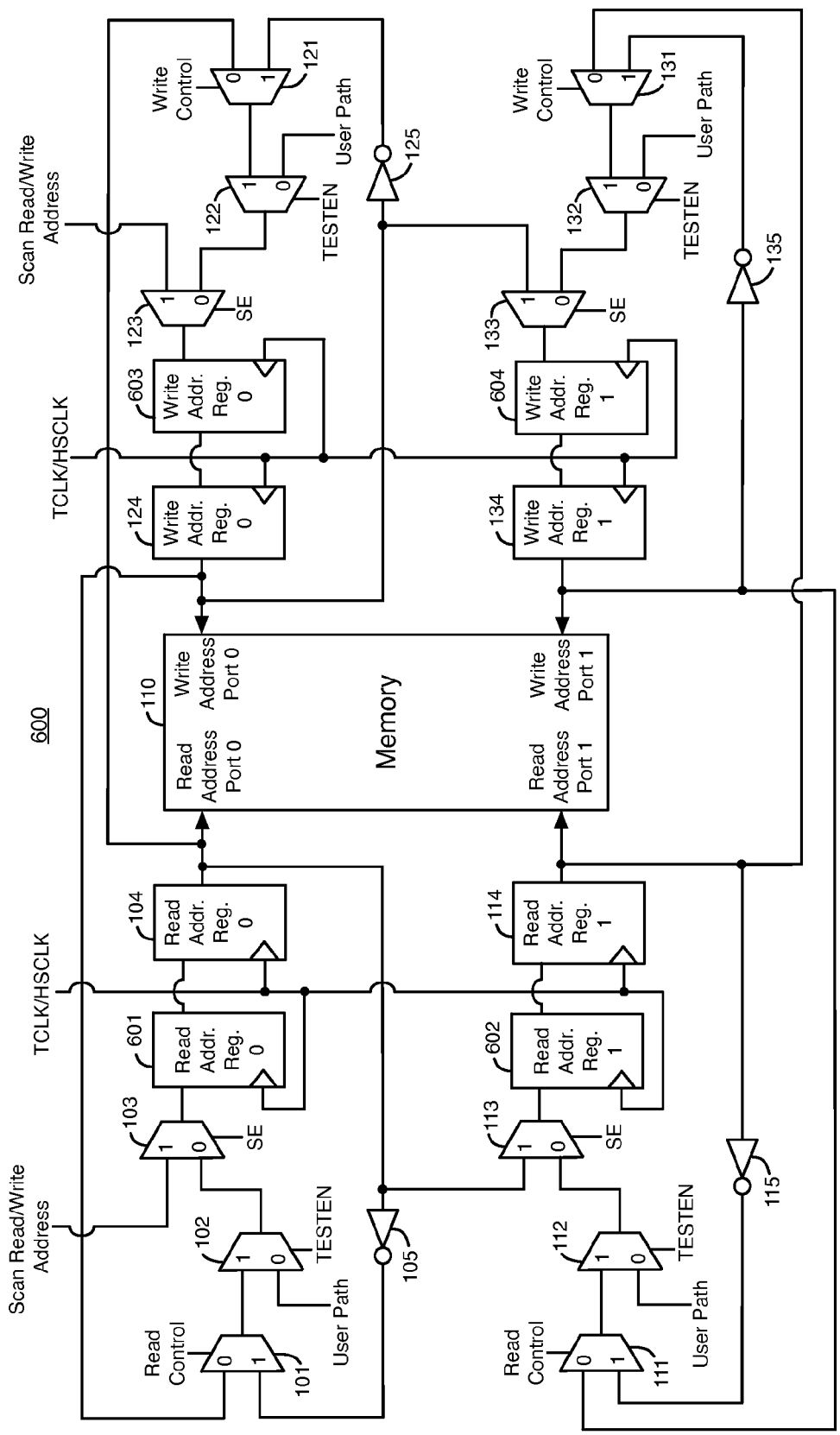
FIG. 6 illustrates an example of circuitry that can be used to load 3 or 4 addresses into a memory circuit at a high frequency, according to an embodiment of the present invention.

According to an alternative embodiment of the present invention, the configurations of FIGS. 1 and 3 can be modified so that three or more read and/or write operations can be performed in three or more consecutive clock cycles of the high-speed clock signal HSCLK during a test of the memory circuit. FIG. 6 illustrates an example of circuitry that can be used to load 3 or 4 addresses into a memory circuit in consecutive clock cycles at a high frequency, according to an embodiment of the present invention. Circuit 600 of FIG. 6 includes memory circuit 110; multiplexers 101-103, 111-113, 121-123, and 131-133; read address registers 104, 114, 601, and 602; write address registers 124, 134, 603, and 604; and inverters 105, 115, 125, and 135. The circuitry of FIG. 6 includes 4 additional registers 601-604 compared to the circuitry of FIG. 1.

In circuit 600, a third read address register 601 is coupled in series with register 104 between the output terminal of multiplexer 103 and the data input terminal of register 104. A fourth read address register 602 is coupled in series with register 114 between the output terminal of multiplexer 113 and the data input terminal of register 114. A third write address register 603 is coupled in series with register 124 between the output terminal of multiplexer 123 and the data input terminal of register 124. A fourth write address register 604 is coupled in series with register 134 between the output terminal of multiplexer 133 and the data input terminal register 134.

The registers 601-604 are driven by the test clock signal TCLK when the address bits are serially shifted into the registers during each slow scan. Registers 601-604 are driven by the high-speed clock signal HSCLK when the address bits are loaded into memory circuit 110 during each at-speed test. Address registers 601-604 allow 3 or 4 read and/or write addresses to be serially loaded into memory 110 in 3 or 4 consecutive clock cycles at the frequency of HSCLK during a test of memory 110.

For example, four read address bits are serially shifted into registers 601, 104, 602, and 114 through multiplexers 103 and 113, when the SE signal is in a logic high state. Four more read address bits are serially shifted into registers 603, 124, 604, and 134 through multiplexers 123 and 133, when the SE signal is in a logic high state. The 8 address registers are driven by the low frequency TCLK signal, while the read address bits are serially shifted into the registers during a slow scan.

Memory circuit 110 can then be tested, for example, by loading four read addresses into memory circuit 110 in four consecutive clock cycles of the high-speed clock signal HSCLK, while the address registers are driven by HSCLK. During the at-speed test, the SE signal is in a logic low state, the TESTEN signal is in a logic high state, the Read Control signal is in a logic low state, and the Write Control signal is in a logic high state.

In the first and second consecutive clock cycles of HSCLK, the two read address bits stored in registers 601 and 104 are serially loaded into memory circuit 110 through read address port 0, and the two read address bits stored in registers 602 and 114 are serially loaded into memory circuit 110 through read address port 1. Also, in the first two consecutive clock cycles of HSCLK, the next two read address bits stored in registers 124 and 603 are shifted into registers 104 and 601, respectively, through multiplexers 101-103, and the next two read address bits stored in registers 134 and 604 are shifted into registers 114 and 602, respectively, through multiplexers 111-113. In the third and fourth consecutive clock cycles of HSCLK, the next two read address bits stored in registers 104 and 601 are serially loaded into memory circuit 110 through read address port 0, and the next two read address bits stored in registers 114 and 602 are serially loaded into memory circuit 110 through read address port 1.

Circuit 600 can also load four write addresses into memory circuit 110 through write address ports 0 and 1 to test memory circuit 110 in four consecutive clock cycles of high-speed clock signal HSCLK by loading write address bits from the read address registers into the write address registers and then into memory circuit 110. During the four consecutive write operations, address registers 104, 114, 124, 134, and 601-604 are driven by HSCLK, the Read Control signal is in a logic high state, and the Write Control signal is in a logic low state.

In addition, circuit 600 can load read and write addresses into the read and write address ports to test memory circuit 110 in four consecutive clock cycles of HSCLK. During the consecutive read and write operations, address registers 104, 114, 124, 134, and 601-604 are driven by HSCLK, the Read Control signal is in a logic high state, and the Write Control signal is in a logic high state. Two read and/or write address bits are serially loaded into memory circuit 110 from the address registers in the first and second consecutive clock cycles of HSCLK. The circuit paths through inverters 105, 115, 125, and 135 and the multiplexers are used to transmit inverted values of the address bits back to the address registers to be serially loaded into memory circuit 110 during the third and fourth clock cycles of HSCLK.

Figure 7:
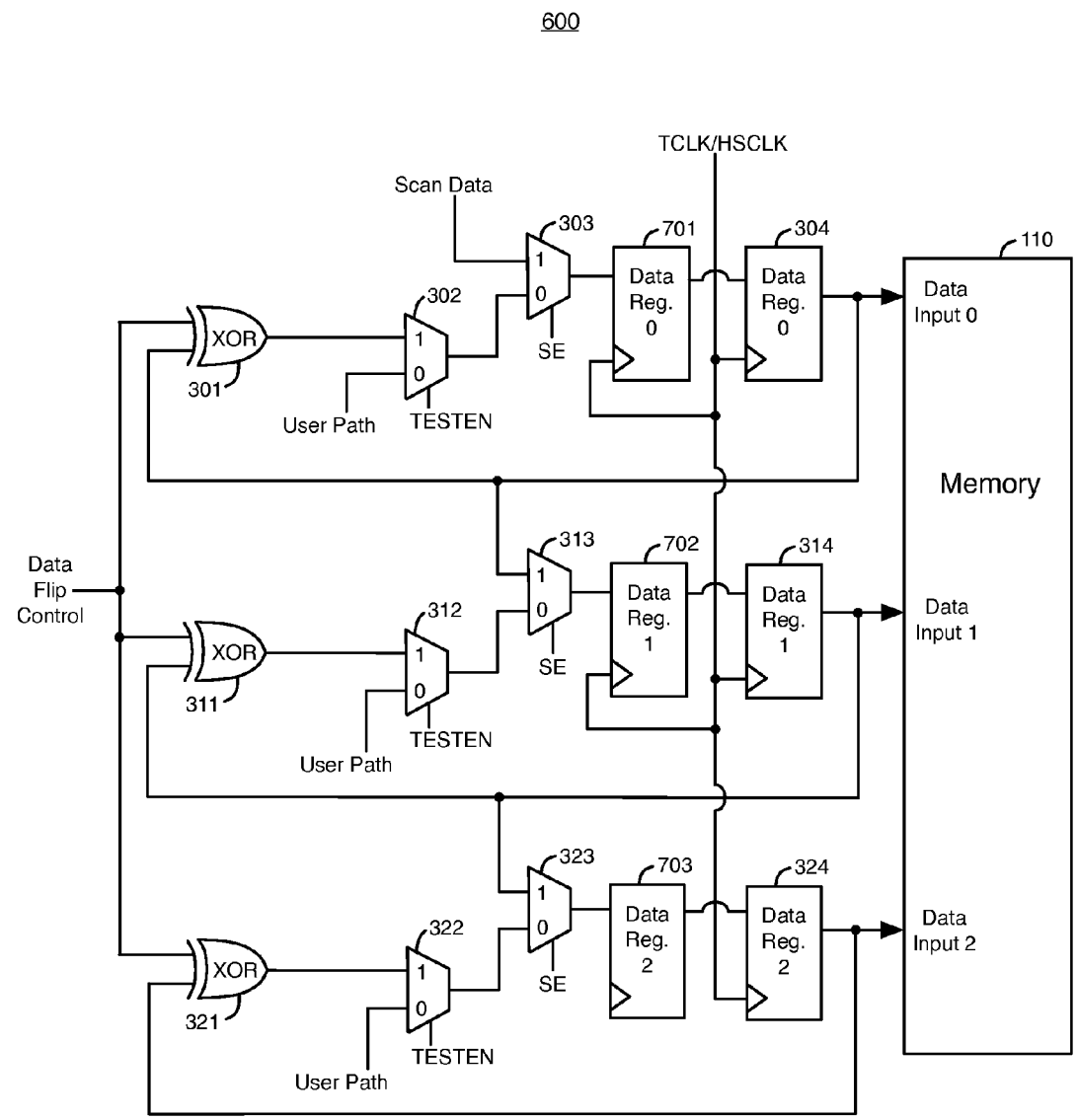
FIG. 7 illustrates an example of circuitry that can be used to load 3 or 4 sets of data bits into a memory circuit at a high frequency, according to an embodiment of the present invention.

FIG. 7 illustrates an example of circuitry that can be used to load 3 or 4 sets of data bits into a memory circuit at a high frequency in consecutive clock cycles, according to an embodiment of the present invention. FIG. 7 shows an additional portion of circuit 600. Circuit 600 includes memory circuit 110, data registers 304, 314, 324, and 701-703; multiplexers 302-303, 312-313, and 322-323; and XOR gates 301, 311, and 321. The circuitry of FIG. 7 includes 3 additional registers 701-703 compared to the circuitry shown in FIG. 3.

A first set of six data bits are serially shifted into data registers 304, 314, 324, and 701-703 during a slow scan through multiplexers 303, 313, and 323. During the slow scan, the SE signal is in a logic high state and the data registers are driven by the low frequency TCLK clock signal. After the data bits are stored in the data registers, the data bits are loaded into memory circuit 110 through data inputs 0-2 at the frequency of HSCLK in 4 consecutive clock cycles during an at-speed test of memory circuit 110. During the at-speed test of memory circuit 110, the SE signal is in a logic low state, the TESTEN signal is in a logic high state, and the data registers are driven by the HSCLK signal.

In the first two consecutive clock cycles of HSCLK, the first set of data bits are loaded from data registers 304, 314, 324, and 701-703 into memory circuit 110 through data inputs 0-2 at the frequency of HSCLK. Also during the first two consecutive clock cycles of HSCLK, data registers 304, 314, 324, and 701-703 store a second set of data bits after the first set of data bits are transmitted through XOR gates 301, 311, and 321 and the multiplexers. The Data Flip Control signal determines whether the XOR gates flip the logic states of the second set of data bits or maintain the logic states of the second set of data bits the same as the first set of data bits. During third and fourth consecutive clock cycles of HSCLK, the second set of data bits are loaded from data registers 304, 314, 324, and 701-703 into memory circuit 110 through data inputs 0-2 at the frequency of HSCLK. The data bits are loaded into memory circuit 110 during 4 consecutive clock cycles of HSCLK.

The data bits are loaded into memory circuit 110 at the frequency of HSCLK at the same time that corresponding write address bits are loaded into memory circuit 110 using the circuitry shown in FIG. 6. The write address bits indicate the memory addresses to store the data bits in memory 110.

Techniques of the present invention can be used to test numerous types of memory circuits such as, for example, true dual-port memories, simple dual-port memories, and single-port memories.

Figure 8:
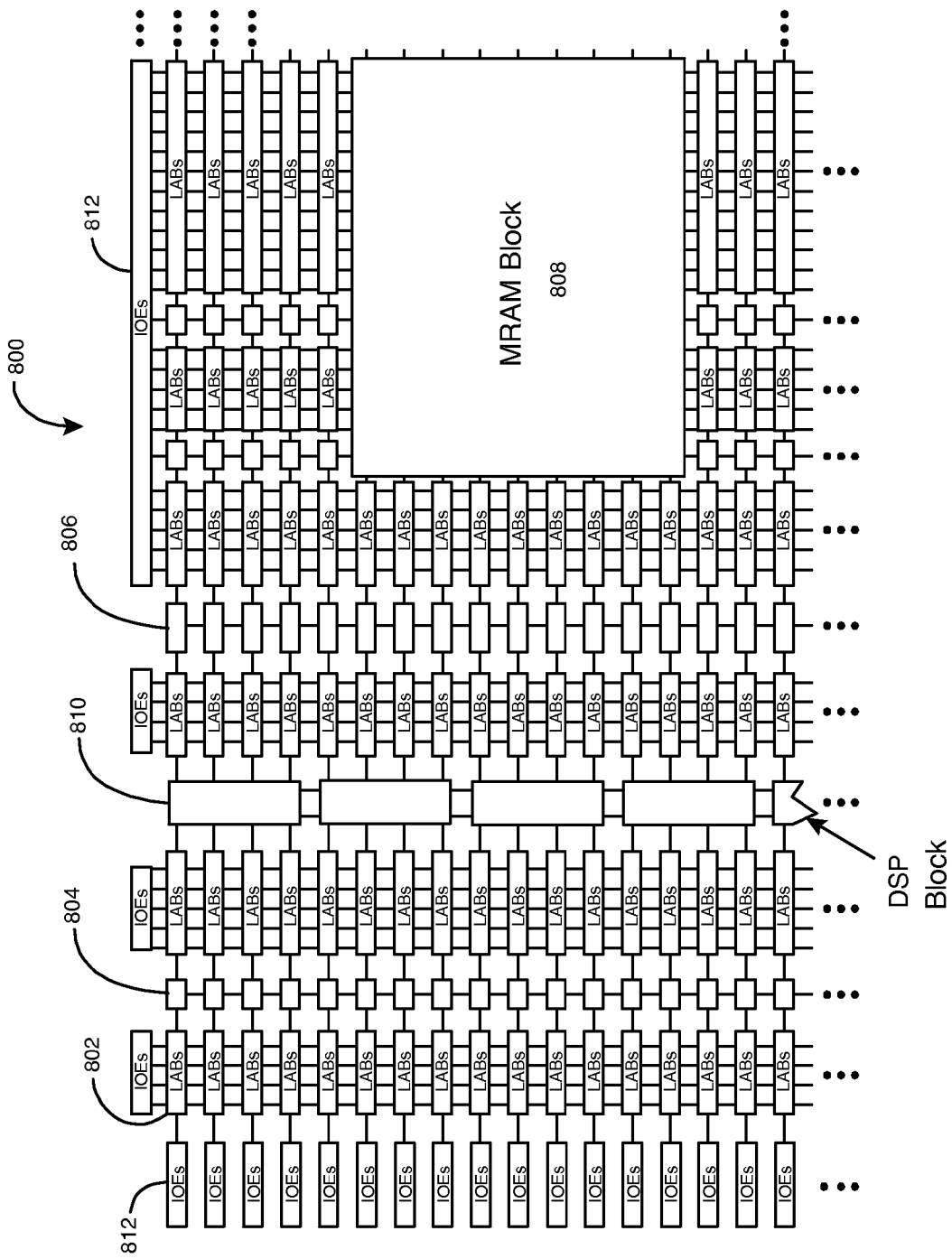
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and FIFO buffers. Each of the memory blocks 804, 806, and 808 can include circuit 100 shown in FIGS. 1 and 3 or circuit 600 shown in FIGS. 6-7.

FPGA 800 further includes digital signal processing (DSP) blocks 810 that can implement, for example, multipliers with add or subtract features. Input/output elements (IOEs) 812 located, in this example, around the periphery of the chip support numerous single-ended and differential input/output standards. IOEs 812 are coupled to input/output pins. Each of the input/output pins is an external terminal of the FPGA. It is to be understood that FPGA 800 is described herein for illustrative purposes only and that the present invention can be implemented in many different types of PLDs, FPGAs, and ASICs.

Figure 9:
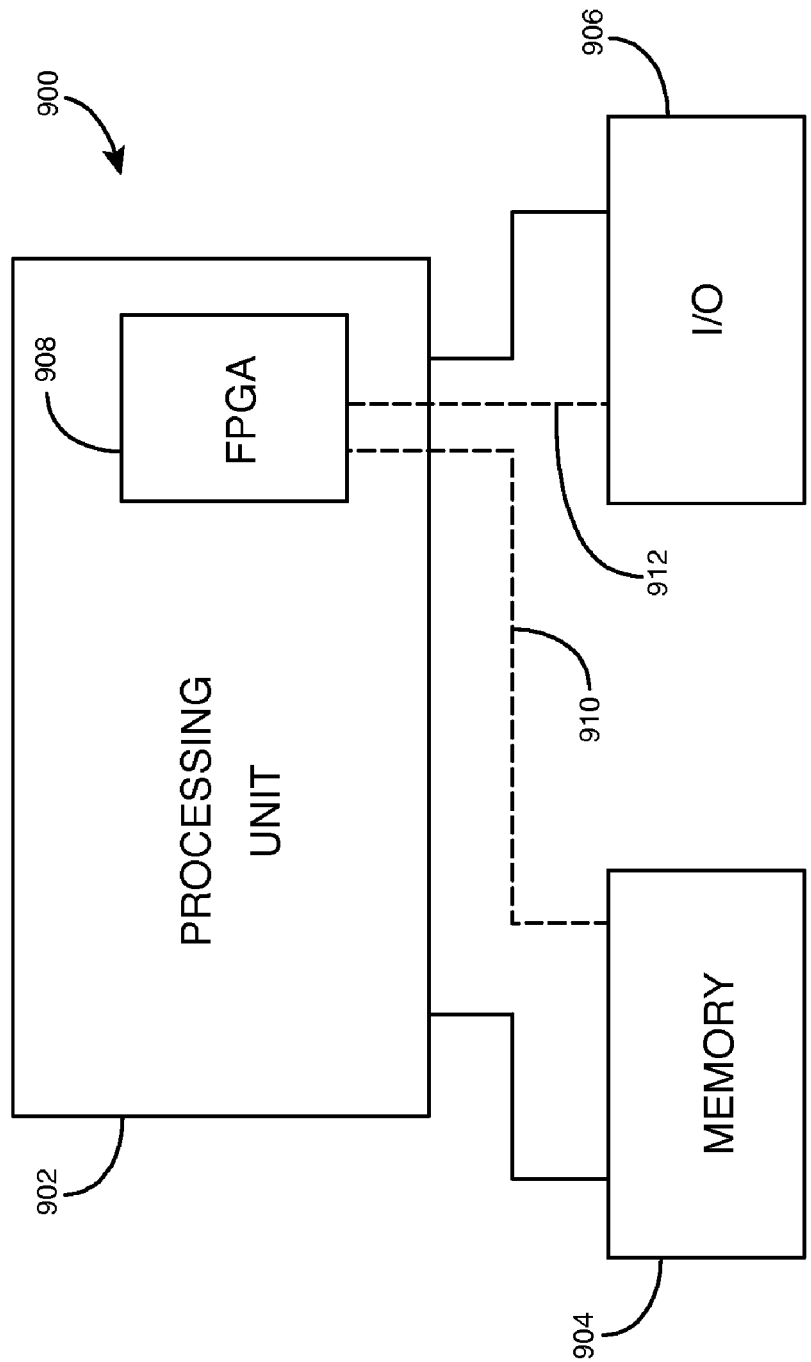
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor, which can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. An integrated circuit comprising:
   a memory circuit;
   a first read address register coupled to a first read address port of the memory circuit;
   a first write address register coupled to a first write address port of the memory circuit; and
   a first multiplexer configurable to transmit a first read address bit from the first write address register to the first read address register in response to a read control signal, wherein the first read address register loads the first read address bit into the memory circuit through the first read address port during a test of the memory circuit.

2. The integrated circuit defined in claim 1 further comprising:
   a second multiplexer configurable to transmit a first write address bit from the first read address register to the first write address register in response to a write control signal, wherein the first write address register loads the first write address bit into the memory circuit through the first write address port during the test of the memory circuit.

3. The integrated circuit defined in claim 2 further comprising:
   a clock routing network that transmits a high-speed clock signal to the first read and write address registers during the test and a test clock signal to the first read and write address registers while address bits are shifted into the first read and write address registers, wherein a frequency of the high-speed clock signal is greater than a frequency of the test clock signal.

4. The integrated circuit defined in claim 2 wherein the first read address register loads a second read address bit and then the first read address bit into the memory circuit through the first read address port during the test in two consecutive cycles of a first clock signal, and wherein the first write address register loads a second write address bit and then the first write address bit into the memory circuit through the first write address port during the test in two consecutive cycles of the first clock signal.

5. The integrated circuit defined in claim 4 further comprising:
- a third multiplexer configurable to transmit the second read address bit to the first read address register in response to a scan enable signal while the first read address register is driven by a second clock signal having a smaller frequency than the first clock signal, wherein the third multiplexer is configurable to transmit the first read address bit from the first multiplexer to the first read address register in response to the scan enable signal during the test; and
- a fourth multiplexer configurable to transmit the second write address bit to the first write address register in response to the scan enable signal while the first write address register is driven by the second clock signal, wherein the fourth multiplexer is configurable to transmit the first write address bit from the second multiplexer to the first write address register in response to the scan enable signal during the test.

6. The integrated circuit defined in claim 2 further comprising:
- an inverter that inverts a second read address bit stored in the first read address register and transmits the inverted second read address bit to the first multiplexer, wherein the first write address register loads a second write address bit into the memory circuit in a first cycle of a first clock signal and then the first read address register loads the inverted second read address bit into the memory circuit in a second consecutive cycle of the first clock signal during the test.

7. The integrated circuit defined in claim 2 further comprising:
- an inverter that inverts a second write address bit stored in the first write address register and transmits the inverted second write address bit to the second multiplexer, wherein the first read address register loads a second read address bit into the memory circuit in a first cycle of a first clock signal and then the first write address register loads the inverted second write address bit into the memory circuit in a second consecutive cycle of the first clock signal during the test.

8. The integrated circuit defined in claim 2 further comprising:
- a second read address register coupled to a second read address port of the memory circuit;
- a second write address register coupled to a second write address port of the memory circuit;
- a third multiplexer configurable to transmit a second read address bit from the second write address register to the second read address register in response to the read control signal, wherein the second read address register loads the second read address bit into the memory circuit through the second read address port during the test of the memory circuit; and
- a fourth multiplexer configurable to transmit a second write address bit from the second read address register to the second write address register in response to the write control signal, wherein the second write address register loads the second write address bit into the memory circuit through the second write address port during the test of the memory circuit.

9. The integrated circuit defined in claim 1 further comprising:
- a first data register coupled to a first data input of the memory circuit;
- a first logic gate coupled to receive an output signal of the first data register and a data flip control signal;
- a second multiplexer coupled to transmit an output signal of the first logic gate to an input terminal of the first data register;
- a second data register coupled to a second data input of the memory circuit;
- a second logic gate coupled to receive an output signal of the second data register and the data flip control signal; and
- a third multiplexer coupled to transmit an output signal of the second logic gate to an input terminal of the second data register,
- wherein the first and the second data registers load first and second data bits into the memory circuit in a first clock cycle, and the output signals of the first and the second logic gates into the memory circuit in a second consecutive clock cycle during the test.

10. The integrated circuit defined in claim 9 wherein the programmable logic integrated circuit is part of a system that includes a memory device and an input/output device.

11. The integrated circuit defined in claim 1 wherein the integrated circuit is a programmable logic integrated circuit.

12. An integrated circuit comprising:
- a memory circuit;
- a first data register coupled to a first data input of the memory circuit;
- a first logic gate coupled to receive a flip data control signal and a first data bit from the first data register; and
- a first multiplexer coupled to transmit an output signal of the first logic gate to the first data register in response to a scan enable signal,
- wherein the first data register loads the first data bit and a second data bit into the memory circuit through the first data input during a test of the memory circuit in two consecutive cycles of a first clock signal, the second data bit being generated from the output signal of the first logic gate.

13. The integrated circuit defined in claim 12 further comprising:
- a second data register coupled to a second data input of the memory circuit;
- a second logic gate coupled to receive the flip data control signal and a third data bit from the second data register; and
- a second multiplexer coupled to transmit an output signal of the second logic gate to the second data register in response to the scan enable signal,
- wherein the second data register loads the third data bit and a fourth data bit into the memory circuit through the second data input during the test of the memory circuit in two consecutive cycles of the first clock signal, the fourth data bit being generated from the output signal of the second logic gate.

14. The integrated circuit defined in claim 13 further comprising:
- a third data register coupled to a third data input of the memory circuit;
- a third logic gate coupled to receive the flip data control signal and a fifth data bit from the third data register; and
- a third multiplexer coupled to transmit an output signal of the third logic gate to the third data register in response to the scan enable signal,
- wherein the third data register loads the fifth data bit and a sixth data bit into the memory circuit through the third data input during the test of the memory circuit in two consecutive cycles of the first clock signal, the sixth data bit being generated from the output signal of the third logic gate.

15. The integrated circuit defined in claim 14 wherein the first, the second, and the third logic gates are exclusive OR gates.

16. The integrated circuit defined in claim 12 wherein the first, the third, and the fifth data bits are serially shifted into the first, the second, and the third data registers through the first, the second, and the third multiplexers, respectively, when the first, the second, and the third data registers are driven by a second clock signal that has a lower frequency than the first clock signal.

17. An integrated circuit comprising:
a memory circuit;
a first read address register coupled to a first read address port of the memory circuit;
a first write address register coupled to a first write address port of the memory circuit; and
a first multiplexer configurable to transmit a first write address bit from the first read address register to the first write address register in response to a write control signal, wherein the first write address register loads the first write address bit into the memory circuit through the first write address port during a test of the memory circuit.

18. The integrated circuit defined in claim 17 further comprising:
a first data register coupled to a first data input of the memory circuit;
a first logic gate coupled to receive an output signal of the first data register and a data flip control signal; and
a second multiplexer coupled to transmit an output signal of the first logic gate to an input terminal of the first data register, wherein the first data register loads a first data bit into the memory circuit in a first clock cycle, and the output signal of the first logic gate into the memory circuit in a second consecutive clock cycle during the test, and wherein a second write address bit and the first write address bit are loaded into the memory circuit from the first write address register in the first and the second consecutive clock cycles.

19. A method for testing a memory circuit, the method comprising:
transmitting a first write address bit from a first read address register to a first write address register in response to a write control signal;
loading the first write address bit from the first write address register into the memory circuit through a first write address port during a test of the memory circuit;
transmitting a first read address bit from the first write address register to the first read address register in response to a read control signal; and
loading the first read address bit from the first read address register into the memory circuit through a first read address port during the test.

20. The method defined in claim 19 further comprising:
transmitting a second write address bit to the first write address register while the first write address register is driven by a first clock signal,
wherein loading the first write address bit from the first write address register into the memory circuit through the first write address port further comprises loading the second write address bit and then the first write address bit into the memory circuit through the first write address port during the test in consecutive cycles of a second clock signal that has a greater frequency than the first clock signal; and
transmitting a second read address bit to the first read address register while the first read address register is driven by the first clock signal,
wherein loading the first read address bit from the first read address register into the memory circuit through the first read address port further comprises loading the second read address bit and then the first read address bit into the memory circuit through the first read address port during the test in consecutive cycles of the second clock signal.

21. The method defined in claim 19 further comprising:
inverting a second read address bit stored at an output terminal of a second read address register;
storing the inverted second read address bit at the output terminal of the second read address register;
loading a second write address bit from a second write address register into the memory circuit through a second write address port during the test in a first cycle of a clock signal; and
loading the inverted second read address bit from the second read address register into the memory circuit through a second read address port during the test in a second consecutive cycle of the clock signal.

22. The method defined in claim 19 further comprising:
storing a first data bit at an output terminal of a data register;
generating a second data bit at an output terminal of a first logic gate in response to the first data bit and a flip data control signal; and
transmitting the second data bit to the data register; and
loading the first and the second data bits into the memory circuit through a data input during the test in two consecutive cycles of a clock signal.

* * * * *